United States Patent
Hung et al.

(10) Patent No.: US 10,325,662 B2
(45) Date of Patent: Jun. 18, 2019

(54) CIRCUIT AND METHOD FOR ADJUSTING SELECT GATE VOLTAGE OF NON-VOLATILE MEMORY DURING ERASURE OF MEMORY CELLS BASED ON A WELL VOLTAGE

(71) Applicant: MACRONIX International Co., Ltd., Hsinchu (TW)

(72) Inventors: Shuo-Nan Hung, Hsinchu (TW); Shin-Jang Shen, Hsinchu (TW); Wei-Jen Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/705,001

(22) Filed: Sep. 14, 2017

(65) Prior Publication Data
US 2018/0005699 A1    Jan. 4, 2018

Related U.S. Application Data

(62) Division of application No. 14/471,769, filed on Aug. 28, 2014, now Pat. No. 9,805,803.

(51) Int. Cl.
*G11C 11/34* (2006.01)
*G11C 16/06* (2006.01)
*G11C 16/14* (2006.01)
*G11C 16/04* (2006.01)
*G11C 16/08* (2006.01)

(52) U.S. Cl.
CPC .......... *G11C 16/14* (2013.01); *G11C 16/0483* (2013.01); *G11C 16/08* (2013.01)

(58) Field of Classification Search
CPC ...... G11C 16/14; G11C 16/08; G11C 16/0483
See application file for complete search history.

(56) References Cited

U.S. PATENT DOCUMENTS

| 2008/0181020 A1* | 7/2008 | Yu ...................... G11C 16/0483 365/185.27 |
| 2010/0238730 A1* | 9/2010 | Dutta .................. G11C 11/5635 365/185.17 |
| 2011/0149659 A1* | 6/2011 | Goda ..................... G11C 16/16 365/185.19 |
| 2013/0314995 A1* | 11/2013 | Dutta .................... G11C 7/1006 365/185.17 |
| 2014/0198575 A1* | 7/2014 | Dutta ................. G11C 16/3418 365/185.17 |

* cited by examiner

*Primary Examiner* — Toan K Le
(74) *Attorney, Agent, or Firm* — J.C. Patents

(57) ABSTRACT

A circuit for adjusting a select gate voltage of a non-volatile memory is provided. The circuit includes a well, a select gate, and an adjustment unit. There is a capacitive coupling between the well and the select gate. The adjustment unit generates a driving voltage for the select gate based on a non-constant voltage.

4 Claims, 8 Drawing Sheets

CIRCUIT AND METHOD FOR ADJUSTING SELECT GATE VOLTAGE OF NON-VOLATILE MEMORY DURING ERASURE OF MEMORY CELLS BASED ON A WELL VOLTAGE

CROSS-REFERENCE TO RELATED APPLICATION

This application is a divisional application of and claims the priority benefit of U.S. application Ser. No. 14/471,769, filed on Aug. 28, 2014, now allowed. The entirety of the above-mentioned patent application is hereby incorporated by reference herein and made a part of this specification.

BACKGROUND OF THE INVENTION

Field of the Invention

The present invention relates to a select gate of a non-volatile memory. More particularly, the present invention relates to a circuit and a method for adjusting a select gate voltage of a non-volatile memory.

Description of the Related Art

NAND flash memory is a popular kind of non-volatile memory. A NAND flash memory includes a plurality of blocks. Each block includes a plurality of NAND strings. Each NAND string includes a drain-side select transistor, a source-side select transistor, and multiple cell transistors in series between the two select transistors. Each cell transistor is a memory cell of the flash memory. Each select transistor has a select gate, while each cell transistor has a control gate and a floating gate.

FIG. 1 is a schematic diagram showing a cross section of a drain-side portion of a conventional NAND string. In FIG. 1, "SSL" represents the select gate of the drain-side select transistor. "CG" represents the control gates of the cell transistors. "FG" represents the floating gates of the cell transistors. "DMWL" represents the dummy word line. "WL31" and "WL30" represent two word lines of the flash memory. "PWI" represents the p-well of the NAND string.

As FIG. 1 shows, the drain-side select gate SSL has capacitive coupling with the neighboring dummy word line DMWL, the control gate CG and the floating gate FG under the dummy word line DMWL, and the p-well PWI.

Flash memories use Fowler-Nordheim (FN) tunneling from floating gates to p-well to erase flash cells, which decrease the number of electrons at the floating gates to lower their threshold voltage. To create FN tunneling bias condition, p-well is applied a high voltage (for example, 20V) and word line of memory cells is biased at low voltage (for example, 0V for the word lines, and 2V for edge dummy word lines).

In an erase operation, select gates are not supposed to be erased. Typically, select gates are floated so that they can be coupled high along with the p-well. The floating voltage of a select gate creates electric fields with the neighboring nodes. However, it is a trade-off about the final voltage of select gates.

If the select gate SSL is coupled to a high voltage due to the capacitive coupling between the select gate SSL and the neighboring p-well PWI, the vertical electric field (Ey) can be eased, yet a large horizontal electric field (Ex) exists between the neighboring floating gate FG and the select gate SSL. This might cause the electrons to tunnel out from the neighboring floating gate FG to inject to the channel under the space between the select gate SSL and the floating gate FG. The accumulation of these electrons over time will deplete the channel, increasing the threshold voltage of the select gate and decreasing cell "on" current. This is a concern of endurance for NAND flash memories.

If the select gate SSL is coupled to a relative low voltage, the vertical electric field (Ey) between the select gate SSL and the p-well PWI during erase operation would be larger. Such a vertical electric field stresses the oxide between the p-well PWI and the select gate SSL, inducing electrons to trap in the oxide. Electrons trapped in the oxide can affect string conductivity and cause reliability issue.

FIG. 2 is a schematic diagram showing a circuit 200 that is a part of a conventional NAND flash memory. The capacitor 206 represents the capacitive coupling between the select gate SSL and the p-well PWI of a NAND string of the NAND flash memory. The pass transistor 204 conducts the driving voltage GSSL to drive the select gate SSL. The pass transistor 204 is an n-channel metal-oxide-semiconductor field-effect transistor. The switch 202 provides the constant voltage 4V as the driving voltage GSSL. The switch 203 provides the constant voltage 0V as the driving voltage GSSL.

FIG. 3 is a timing diagram showing some voltage signals in the circuit 200 in an erase operation of the NAND flash memory. The voltage signals include the bias voltage PASS_GATE at the gate of the pass transistor 204, the driving voltage GSSL, the voltage of the select gate SSL, and the voltage of the p-well PWI.

Before t0 the switch 202 is opened and the switch 203 is closed. Therefore, GSSL is biased at 0V via the switch 203. At t0 the gate of the pass transistor 204 is biased at 4V. At t1 the switch 203 opens and the switch 202 closes and driving voltage GSSL is biased at 4V as well. As a result, the pass transistor 204 can pass the voltage $(4V-V_{TN})$ to the select gate SSL. $V_{TN}$ is the threshold voltage of the pass transistor 204. Afterwards, the pass transistor 204 remains weakly on to keep the channel voltage at $(4V-V_{TN})$.

The p-well PWI is applied a high erase voltage $V_{ERS}$ (for example, 20V) in the erase operation. As FIG. 3 shows, the p-well PWI is charged to 20V at t2. At the same time, the voltage of the select gate SSL rises up because of the capacitive coupling so as to cut off the pass transistor 204. The select gate SSL is coupled to high voltage along with the p-well PWI to reduce the voltage difference to the p-well PWI. In this duration, those word lines biased at low voltage use FN tunneling to remove electrons in floating gates. The dotted portion of the voltage of the select gate SSL in this duration represents the floating state of the select gate SSL caused by the turning off of the pass transistor 204 at t2.

The p-well PWI is discharged to ground at t3 and the select gate SSL is coupled to low voltage in the same way. When the voltage of the select gate SSL falls back to $(4V-V_{TN})$, the pass transistor 204 becomes conductive again and drives the select gate SSL to the voltage level $(4V-V_{TN})$.

By opening the switch 202 and closing the switch 203, the driving voltage GSSL starts to discharge at t4 and therefore the select gate SSL discharges as well. Finally, the pass transistor 204 is turned off at t5 and the erase operation is finished.

The voltage of the select gate SSL can be high enough to affect the endurance of the NAND flash memory. In this conventional scheme, the timing to float the select gate SSL cannot be freely decided, so that it is hard to adjust the final voltage (the highest voltage) of the select gate SSL through the capacitive coupling.

SUMMARY OF THE INVENTION

Accordingly, the present invention is directed to a circuit for adjusting a select gate voltage of a non-volatile memory. The circuit can adjust the coupling voltage of select gates in an erase operation to prevent the select gate voltage from being coupled too high, thus improving the endurance of the non-volatile memory.

According to an embodiment of the present invention, a circuit for adjusting a select gate voltage of a non-volatile memory is provided. The circuit includes a well, a select gate, an adjustment unit, and a switch. There is a capacitive coupling between the well and the select gate. The adjustment unit generates a driving voltage for the select gate. The switch is coupled in series with the adjustment unit between the select gate and the well.

According to an embodiment of the present invention, a circuit for adjusting a select gate voltage of a non-volatile memory is provided. The circuit includes a well, a select gate, and an adjustment unit. There is a capacitive coupling between the well and the select gate. The adjustment unit generates a driving voltage for the select gate based on a non-constant voltage.

According to an embodiment of the present invention, a method for adjusting a select gate voltage of a non-volatile memory is provided. There is a capacitive coupling between a well and a select gate of the non-volatile memory. The method includes the steps of generating a driving voltage based on a non-constant voltage and conducting the driving voltage to the select gate.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
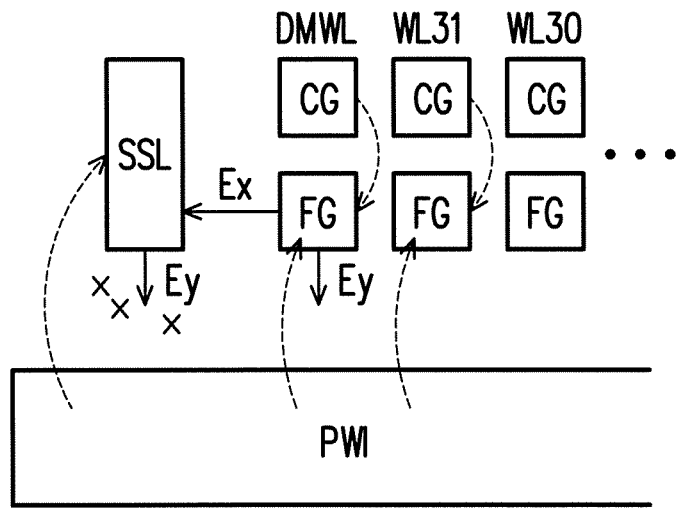
FIG. 1 is a schematic diagram showing a part of a conventional NAND string.
Figure 2:
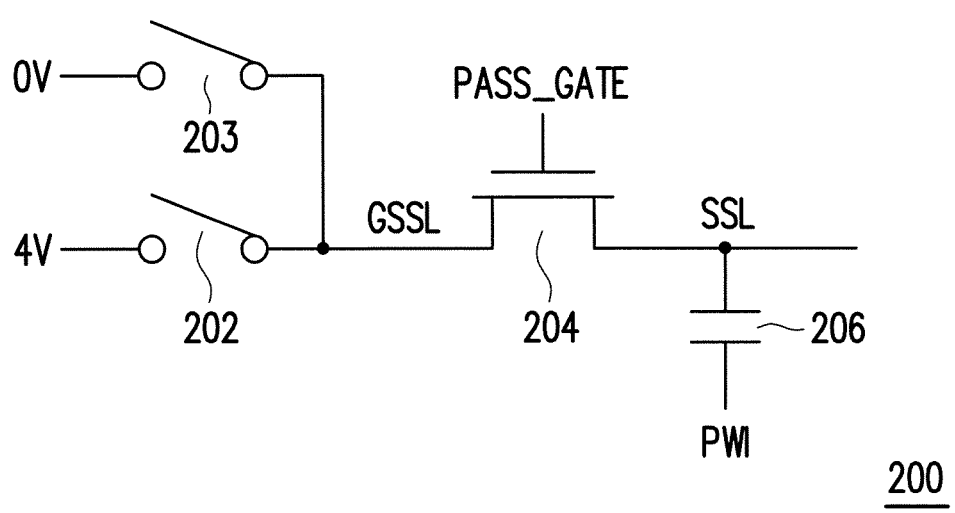
FIG. 2 is a schematic diagram showing a part of a conventional NAND flash memory.
Figure 3:
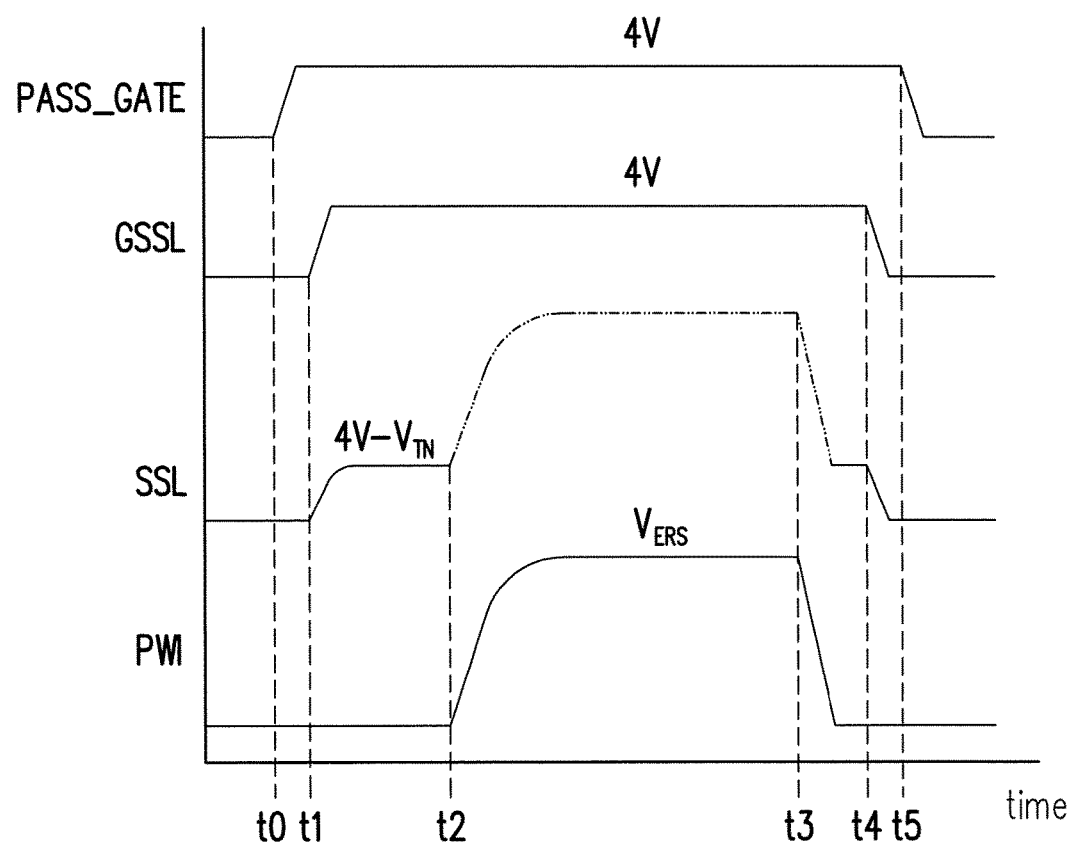
FIG. 3 is a timing diagram showing some voltage signals in the circuit in FIG. 2.

Reference will now be made in detail to the present embodiments of the invention, examples of which are illustrated in the accompanying drawings. Wherever possible, the same reference numbers are used in the drawings and the description to refer to the same or like parts.

Figure 4:
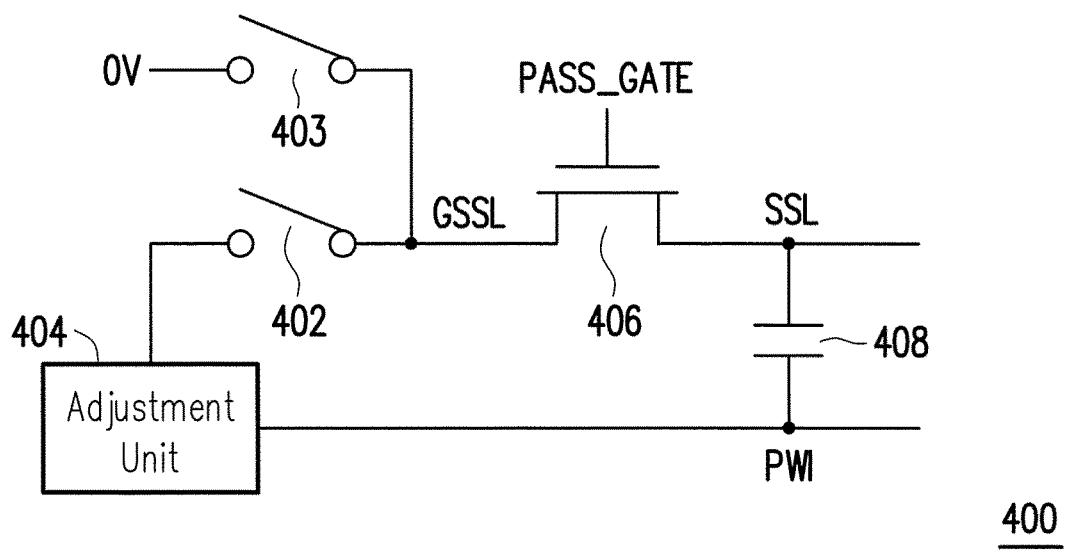
FIG. 4 and FIG. 5 are schematic diagrams showing a circuit for adjusting select gate voltage for an erase operation of a non-volatile memory according to two embodiments of the present invention.

FIG. 4 is a schematic diagram showing a circuit 400 for adjusting select gate voltage for an erase operation of a non-volatile memory according to an embodiment of the present invention. The circuit 400 includes a p-well PWI, a select gate SSL, a pass transistor 406, an adjustment unit 404, and switches 402 and 403. The pass transistor 406 is coupled to the select gate SSL. The adjustment unit 404 is coupled to the p-well PWI. The switch 402 is coupled between the pass transistor 406 and the adjustment unit 404. The switch 403 is coupled to the pass transistor 406.

In this embodiment, the non-volatile memory is a NAND flash memory. The select gate SSL and the p-well PWI is a part of a NAND string of the NAND flash memory. The capacitor 408 represents the capacitive coupling between the select gate SSL and the p-well PWI.

The driving voltage GSSL drives the select gate SSL in part of the erase operation. The adjustment unit 404 generates the driving voltage GSSL based on the voltage of the p-well PWI in the erase operation. The switch 402 conducts the driving voltage GSSL from the adjustment unit 404 to the pass transistor 406 when the switch 402 is closed. The switch 403 conducts the constant voltage 0V as the driving voltage GSSL when the switch 403 is closed. The pass transistor 406 is an n-channel metal-oxide-semiconductor field-effect transistor. The pass transistor 406 turns on and conducts the driving voltage GSSL to the select gate SSL when the bias voltage PASS_GATE rises to a high voltage (for example, 4V). The adjustment unit 404 can adjust and reduce the driving voltage from PWI to GSSL so that the voltage of the select gate SSL does not rise too high in the erase operation.

The bias voltage PASS_GATE equal to 4V is just an example. In another embodiment of the present invention, the bias voltage PASS_GATE may be replaced with another voltage other than 4V.

A NAND flash memory includes a plurality of NAND strings. Each NAND string includes two select transistors. Each select transistor has a select gate. There may an independent circuit 400 for each select gate. Alternatively, a plurality of select gates in the NAND flash memory may share one or more elements of the circuit 400.

The present invention is not limited to NAND flash memories. In another embodiment, the circuit 400 may be applied to other non-volatile memories with similar structure and similar problem.

Figure 5:
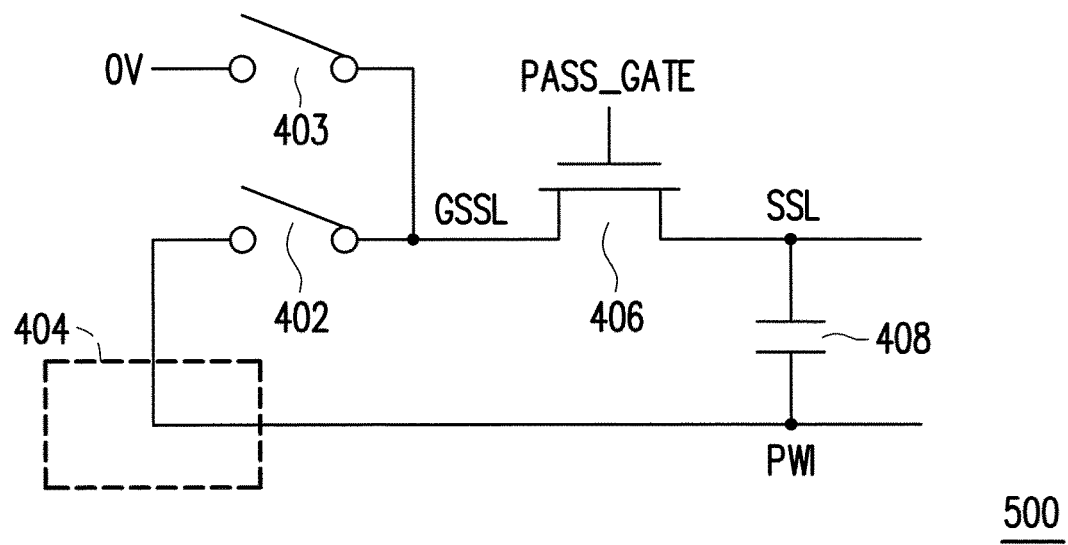

FIG. 5 is a schematic diagram showing a circuit 500 for adjusting select gate voltage for an erase operation of a non-volatile memory according to an embodiment of the present invention. In this embodiment, the adjustment unit 404 directly outputs the voltage of the p-well PWI as the driving voltage GSSL. In the erase operation, the voltage $V_{ERS}$ driving the p-well PWI is used directly to float the select gate SSL.

Figure 6:
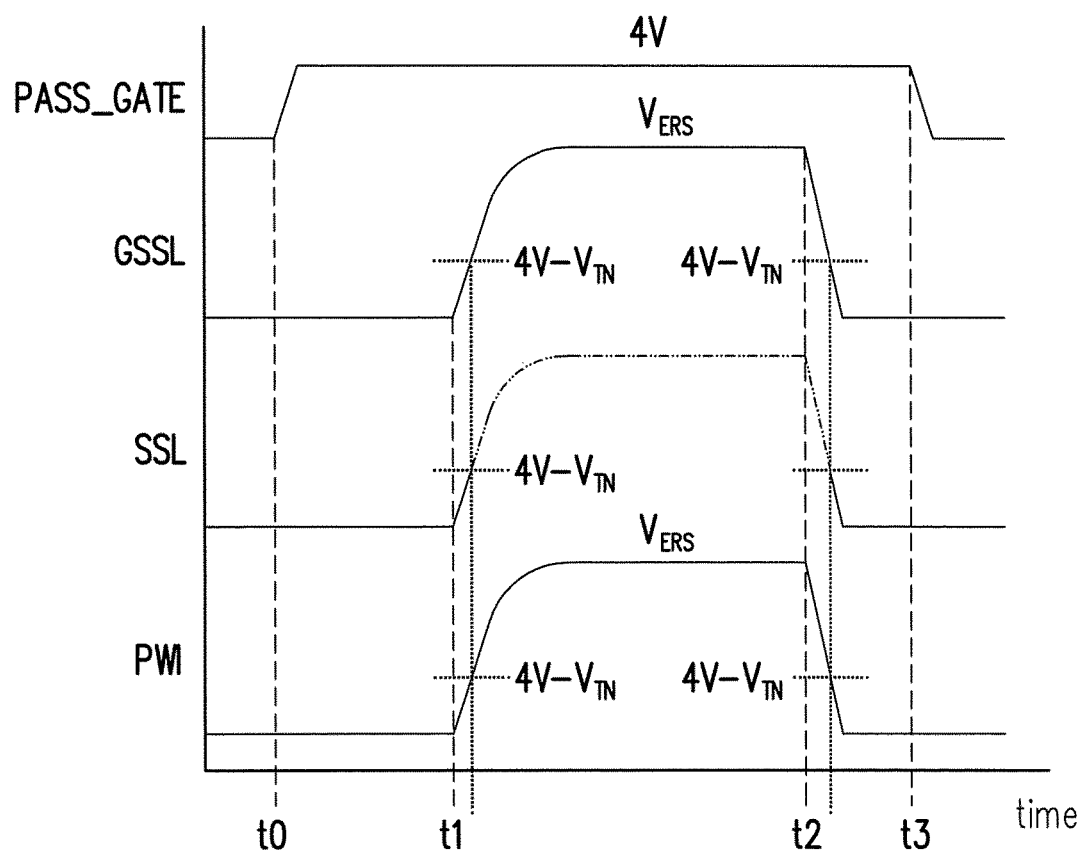
FIG. 6 is a timing diagram showing some voltage signals in the circuit in FIG. 5 according to an embodiment of the present invention.

FIG. 6 is a timing diagram showing some voltage signals in the circuit 500 in FIG. 5 according to an embodiment of the present invention. The voltage signals include the voltage PASS_GATE biasing the pass transistor 406, the driving voltage GSSL, the voltage of the select gate SSL, and the voltage of the p-well PWI.

As FIG. 6 shows, before t0 the switch 402 is opened and the switch 403 is closed. Therefore, GSSL is biased at 0V via the switch 403. The gate side of pass transistor 406 is turn on to 4V at t0 and stuck at 4V all the time until t3. At t1, an erase voltage $V_{ERS}$ (for example, 20V) is applied to the p-well PWI. In addition, the switch 403 opens and the switch 402 closes at t1. Once the driving voltage GSSL, which begins following the voltage of the p-well PWI at t1, surpasses $(4V-V_{TN})$, the pass transistor 406 is cut off and the select gate SSL becomes floated. $V_{TN}$ is the threshold voltage of the pass transistor 406. The dotted portion of the voltage of the select gate SSL represents the floating state of the select gate SSL. At t2 the p-well PWI is discharged. The driving voltage GSSL and the voltage of the select gate SSL decrease accordingly. The pass transistor 406 is turned on when the driving voltage GSSL falls below $(4V-V_{TN})$. The final voltage (the highest voltage) of the select gate SSL is:

$$V_{SSL,final}=(4V-V_{TN})+[V_{ERS}-(4V-V_{TN})]\times R,\ 0<R<1$$

R is the coupling-ratio of the capacitive coupling 408. R is determined by the process of the NAND flash memory.

The adjustment units 404 in the following embodiments reduce the voltage of the p-well PWI to generate the driving voltage GSSL, such as reducing the voltage of the p-well PWI by a voltage divider or by one or more diodes.

Figure 7:
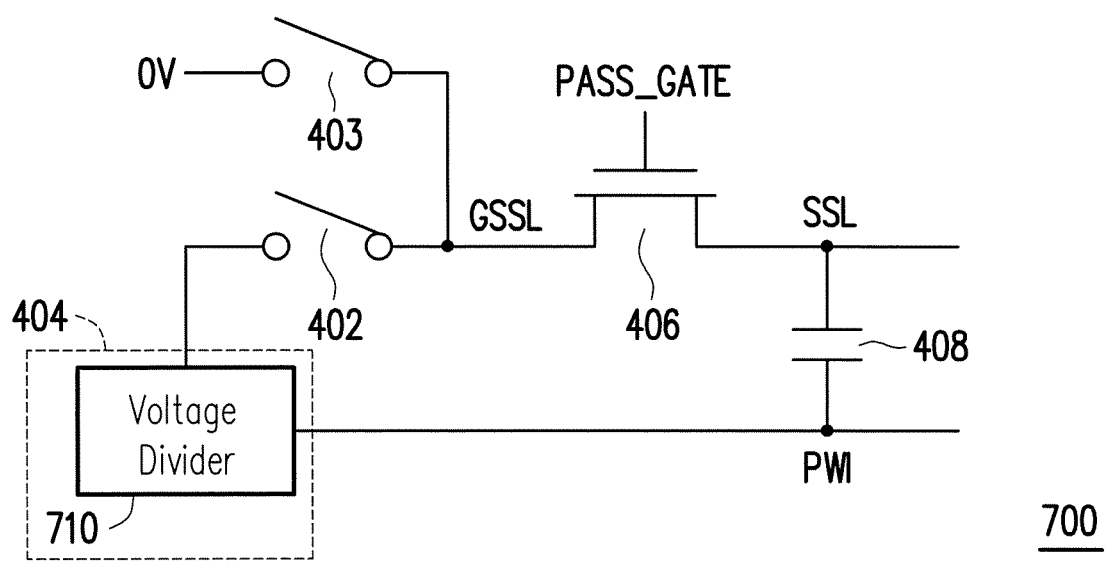
FIG. 7 is a schematic diagram showing a circuit for adjusting select gate voltage for an erase operation of a non-volatile memory according to an embodiment of the present invention.

FIG. 7 is a schematic diagram showing a circuit 700 for adjusting select gate voltage for an erase operation of a non-volatile memory according to an embodiment of the present invention. In this embodiment, instead of outputting the voltage of the p-well PWI directly, the adjustment unit 404 includes a voltage divider 710 coupled between the switch 402 and the p-well PWI. For example, the voltage divider 710 may be a resistor divider. The voltage divider 710 receives the voltage of the p-well PWI and outputs a fraction of the voltage of the p-well PWI as the driving voltage GSSL to bias the select gate SSL in the erase operation.

Figure 8:
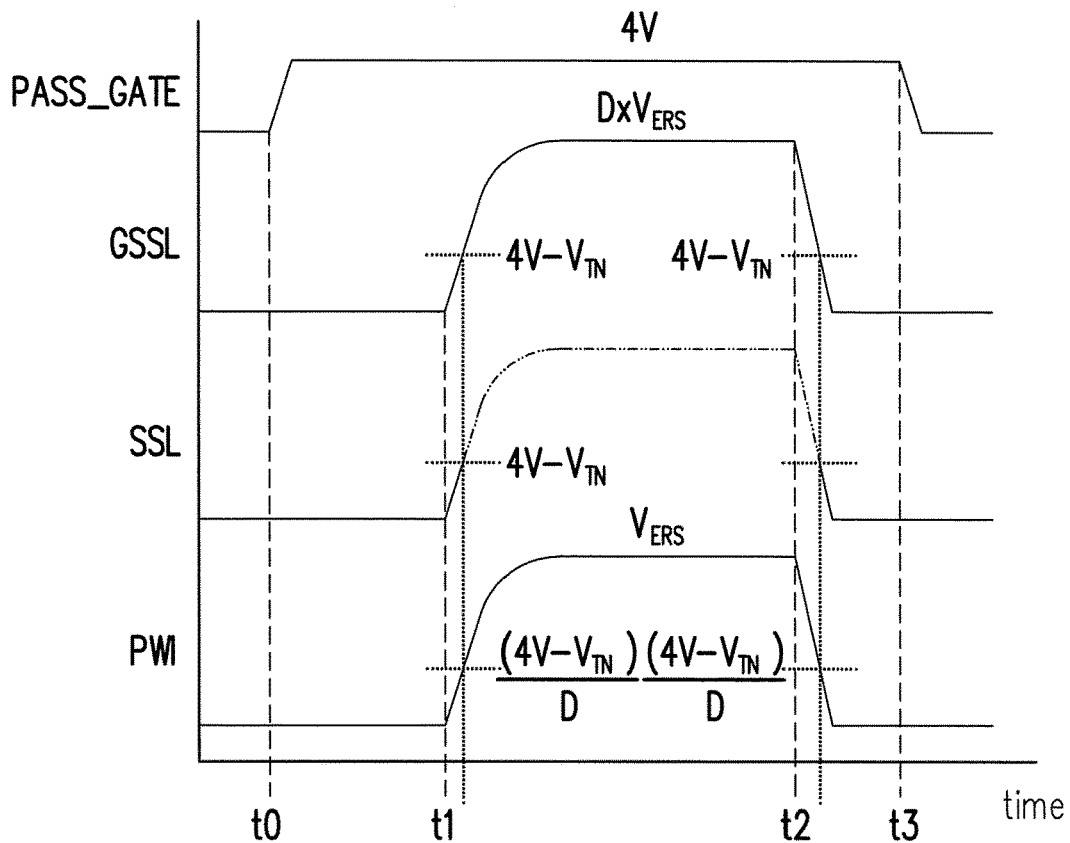
FIG. 8 is a timing diagram showing some voltage signals in the circuit in FIG. 7 according to an embodiment of the present invention.

FIG. 8 is a timing diagram showing some voltage signals in the circuit 700 in FIG. 7 according to an embodiment of the present invention. FIG. 8 is similar to FIG. 7. The select gate SSL is floated only after the output of the voltage divider 710 is larger than $(4V-V_{TN})$. The final voltage (the highest voltage) of the select gate SSL becomes:

$$V_{SSL,final}=(4V-V_{TN})+[V_{ERS}-(4V-V_{TN})/D]\times R,\ 0<R<1,\ 0<D<1$$

R is the coupling-ratio of the capacitive coupling 408. D is the divide-ratio of the voltage divider 710. In this embodiment, the select gate SSL is floated later than the case without the voltage divider 710. The duration of this latency depends on the charging speed of the p-well PWI and the divide-ratio D. The coupling voltage from the p-well PWI to the select gate SSL is reduced and the final voltage of the select gate SSL during erase operation is lower.

The voltage divider 710 divides the voltage of the p-well PWI according to the divide-ratio D to generate the aforementioned fraction of the voltage of the p-well PWI. The divide-ratio D may be a static value built in the voltage divider 710. Alternatively, the divide-ratio D may be a dynamic value received by the voltage divider 710 as an input signal. In this way, the final voltage of the select gate SSL in the erase operation can be adjusted and optimized to optimize the endurance and the reliability of the non-volatile memory.

Figure 9:
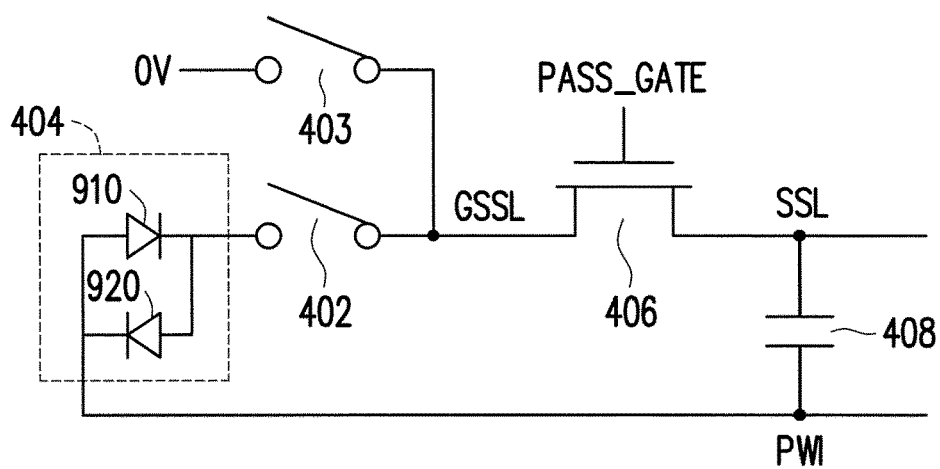
FIG. 9 is a schematic diagram showing a circuit for adjusting select gate voltage for an erase operation of a non-volatile memory according to an embodiment of the present invention.

FIG. 9 is a schematic diagram showing a circuit 900 for adjusting select gate voltage for an erase operation of a non-volatile memory according to an embodiment of the present invention. In this embodiment, the adjustment unit 404 includes a diode 910 coupled between the p-well PWI and the switch 402. Since the voltage of the p-well PWI has to pass through the diode 910 to bias the select gate SSL during erase operation, the voltage drop on the diode 910 can reduce the voltage of the p-well PWI to reduce the voltage of the select gate SSL. The adjustment unit 404 further includes another diode 920 coupled between the p-well PWI and the switch 402 to discharge the driving voltage GSSL. Without the diode 920, the diode 910 would block the discharging of the driving voltage GSSL.

Figure 10:
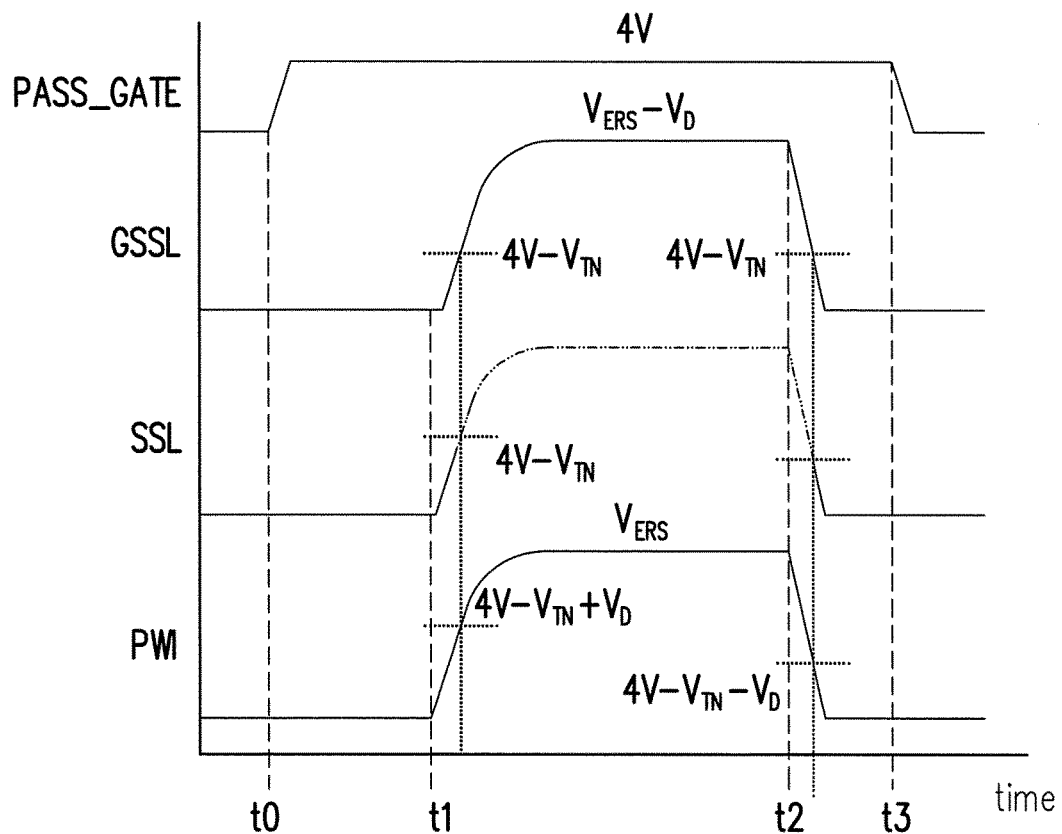
FIG. 10 is a timing diagram showing some voltage signals in the circuit in FIG. 9 according to an embodiment of the present invention.

FIG. 10 is a timing diagram showing some voltage signals in the circuit 900 in FIG. 9 according to an embodiment of the present invention. FIG. 10 is similar to FIG. 6. The select gate SSL is floated when the voltage of the p-well PWI is larger than the driving voltage GSSL by the voltage drop $V_D$ on the diode 910 and the driving voltage GSSL reaches $(4V-V_{TN})$. Therefore, the coupling voltage between the p-well PWI and the select gate SSL can be reduced by $V_D$ further. The final voltage (the highest voltage) of the select gate SSL in erase operation becomes:

$$V_{SSL,final}=(4V-V_{TN})+[V_{ERS}-(4V-V_{TN})-V_D]\times R,\ 0<R<1$$

Figure 11:
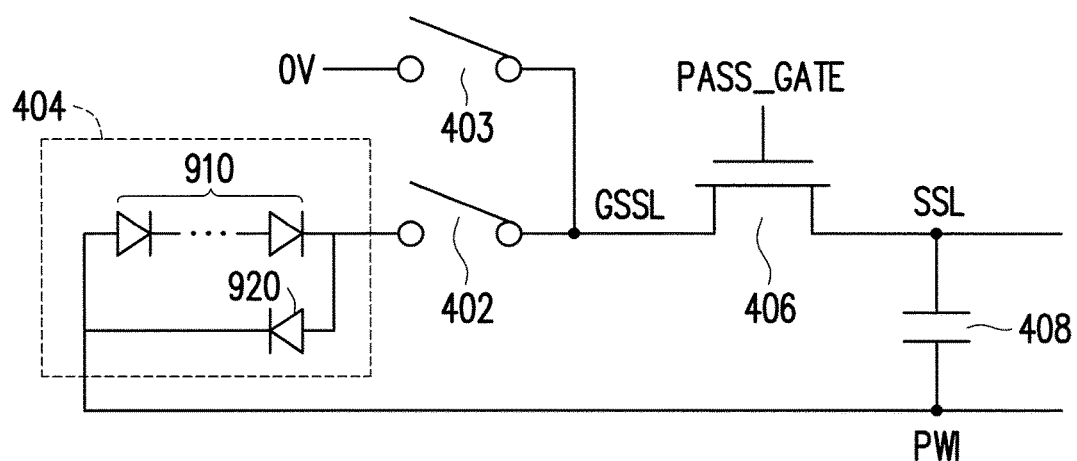
FIG. 11 is a schematic diagram showing a circuit for adjusting select gate voltage for an erase operation of a non-volatile memory according to an embodiment of the present invention.

FIG. 11 is a schematic diagram showing a circuit 1100 for adjusting select gate voltage for an erase operation of a non-volatile memory according to an embodiment of the present invention. In this embodiment, instead of a single diode 910, the adjustment unit 404 includes a plurality of diodes 910 coupled in series between the p-well PWI and the switch 402 to reduce the voltage of the p-well PWI. The multiple diodes 910 can further reduce the bias voltage of the select gate SSL.

Figure 12:
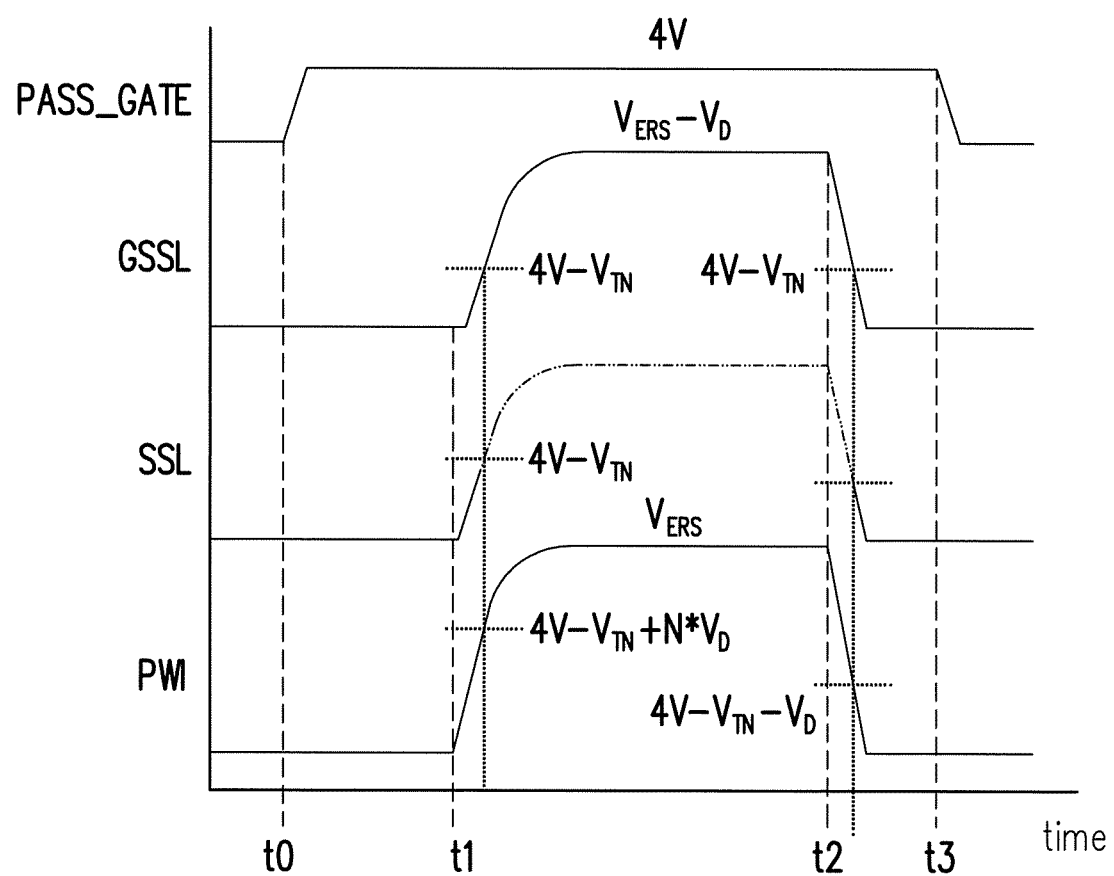
FIG. 12 is a timing diagram showing some voltage signals in the circuit in FIG. 11 according to an embodiment of the present invention.

FIG. 12 is a timing diagram showing some voltage signals in the circuit 1100 in FIG. 11 according to an embodiment of the present invention. FIG. 12 is similar to FIG. 10. Due to the plurality of the diodes 910, the final voltage (the highest voltage) of the select gate SSL in erase operation becomes:

$$V_{SSL,final}=(4V-V_{TN})+[V_{ERS}-(4V-V_{TN})-N*V_D]\times R,\ 0<R<1$$

R is the coupling-ratio between the p-well PWI and the select gate SSL, while N is the number of the diodes 910 coupled in series.

In the previous embodiments, the switch 402 is coupled to the pass transistor 406, while the adjustment unit 404 is coupled between the switch 402 and the p-well PWI. In another embodiment of the present invention, the positions of the switch 402 and the adjustment unit 404 may be exchanged. The adjustment unit 404 may be coupled to the pass transistor 406, while the switch 402 may be coupled between the adjustment unit 404 and the p-well PWI.

In an embodiment of the present invention, a method for adjusting a select gate voltage for an erase operation of a non-volatile memory is provided. The steps of the method may be executed by the circuit 400 in the previous embodiments. The details of the steps of the method are already discussed in the previous embodiments.

In summary, the circuit provided by the present invention can adjust the coupling voltage of select gates to get the optimal voltage for select gates in erase operation, so that non-volatile memory devices can withstand more repeated program/erase cycles without degradation of reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit for adjusting a select gate voltage of a non-volatile memory, comprising:
    a well;
    a select gate, wherein there is a capacitive coupling between the well and the select gate; and
    an adjustment unit generating a driving voltage for the select gate based on a non-constant voltage, where the non-constant voltage is a voltage of the well, and the adjustment unit is configured to:
    directly output the voltage of the well as the driving voltage; or
    reduce the voltage of the well to generate the driving voltage.

2. The circuit of claim 1, wherein the adjustment unit comprises:
    a voltage divider, coupled between the select gate and the well, outputting a fraction of the voltage of the well as the driving voltage.

3. The circuit of claim 1, wherein the adjustment unit comprises:
    at least one diode coupled in series between the well and the select gate to reduce the voltage of the well.

4. A method for adjusting a select gate voltage of a non-volatile memory, wherein there is a capacitive coupling between a well and a select gate of the non-volatile memory, the method comprising:
    generating a driving voltage by using an adjustment unit based on a non-constant voltage, where the driving voltage is generated by directly outputting the voltage of the well as the driving voltage, or reducing the voltage of the well; and
    conducting the driving voltage to the select gate,
    where the non-constant voltage is a voltage of the well.

* * * * *